(12) United States Patent
Bartley et al.

(10) Patent No.: US 10,170,578 B2
(45) Date of Patent: Jan. 1, 2019

(54) THROUGH-SUBSTRATE VIA POWER GATING AND DELIVERY BIPOLAR TRANSISTOR

(71) Applicant: International Business Machines Corporation, Armonk, NY (US)

(72) Inventors: Gerald K. Bartley, Rochester, MN (US); David P. Paulsen, Inver Grove Heights, MN (US); John E. Sheets, II, Zumbrota, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/609,814

(22) Filed: May 31, 2017

(65) Prior Publication Data
US 2018/0350941 A1 Dec. 6, 2018

(51) Int. Cl.
| H01L 29/66 | (2006.01) |
| H01L 23/00 | (2006.01) |
| H01L 29/08 | (2006.01) |
| H01L 29/73 | (2006.01) |
| H01L 29/732 | (2006.01) |

(52) U.S. Cl.
CPC ........ *H01L 29/66234* (2013.01); *H01L 24/16* (2013.01); *H01L 29/0804* (2013.01); *H01L 29/732* (2013.01); *H01L 2224/16221* (2013.01); *H01L 2924/1305* (2013.01)

(58) Field of Classification Search
CPC ............... H01L 29/66234; H01L 24/16; H01L 29/0804; H01L 29/732; H01L 2224/16221; H01L 2924/1305
USPC .......................................... 257/526; 438/309
See application file for complete search history.

(56) References Cited

U.S. PATENT DOCUMENTS

| 5,128,271 A | 7/1992 | Bronner et al. |
| 7,871,882 B2 | 1/2011 | Parthasarathy et al. |
| 8,426,258 B2 | 4/2013 | Molin et al. |
| 8,466,024 B2 | 6/2013 | Bartley et al. |
| 8,492,903 B2 | 7/2013 | Bartley et al. |
| 8,592,921 B2 | 11/2013 | Erickson et al. |
| 8,754,499 B1 | 6/2014 | Erickson et al. |
| 8,809,156 B1 | 8/2014 | Allen et al. |
| 8,823,090 B2 | 9/2014 | Bartley et al. |
| 9,040,406 B2 | 5/2015 | Erickson et al. |
| 9,159,825 B2 | 10/2015 | Molin et al. |
| 9,252,083 B2 | 2/2016 | Erickson et al. |
| 2005/0236617 A1* | 10/2005 | Yamada ................ H01L 23/62 257/48 |
| 2010/0264427 A1* | 10/2010 | Veliadis ............ H01L 29/0619 257/77 |
| 2013/0001676 A1* | 1/2013 | Bartley ............. H01L 29/66666 257/330 |
| 2013/0221433 A1* | 8/2013 | Molin ............... H01L 21/82348 257/330 |

* cited by examiner

*Primary Examiner* — Didarul Mazumder
(74) *Attorney, Agent, or Firm* — Patterson + Sheridan, LLP

(57) ABSTRACT

Embodiments herein describe a through-substrate via formed in a semiconductor substrate that includes a transistor. In one embodiment, the through via includes a BJT which includes different doped semiconductor layers that form a collector, a base, and an emitter. The through via can also include metal contacts to the collector, base, and emitter which enable the through to be coupled to a metal routing layer or a solder bump.

5 Claims, 7 Drawing Sheets

US 10,170,578 B2

THROUGH-SUBSTRATE VIA POWER GATING AND DELIVERY BIPOLAR TRANSISTOR

BACKGROUND

The present invention relates to through vias, and more specifically, to forming a transistor in a through via.

Power gates—e.g., bipolar junction transistors (BJT)—are often used to control power transmission systems in a semiconductor chip—i.e., an integrated circuit (IC). For example, an IC may include one or more power gates that are used to activate, deactivate, or adjust a reference voltage network in the IC (or in another IC in the same package). Power gates, however, are typically larger than other types of switching logic—e.g., complementary metal-oxide-semiconductor (CMOS) transistors—because the power gates must be able to handle larger amounts of current or higher voltages. As such, power gates typically require relatively large amounts of area in an IC. In some examples, a processor may be packaged with an auxiliary chip which includes power regulation circuitry and the power gates in order to save space in the processor. Thus, if the size of the power gates can be reduced, the size and complexity of the auxiliary chip can be reduced or the auxiliary chip can be eliminated altogether.

SUMMARY

Another embodiment of the present disclosure is a method that includes forming a recess in a semiconductor substrate and forming a sidewall insulator in the recess, wherein the sidewall insulator defines an outer boundary of the through-substrate via. The method also includes forming a first semiconductor layer doped with a first-type of dopant within the sidewall insulator, forming a second semiconductor layer doped with a second-type of dopant within the sidewall insulator, and forming a third semiconductor layer doped with the first-type of dopant within the sidewall insulator where the first, second, and third semiconductor layers are arranged in the through-substrate via to form one of: a PNP junction and an NPN junction.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments herein describe a through-substrate via formed in a semiconductor substrate that includes a transistor. In one embodiment, the through-substrate via includes a BJT which include different doped semiconductor layers that form a collector, a base, and an emitter. The through-substrate via can also include metal contacts to the collector, base, and emitter which enable the through-substrate via to be coupled to a metal routing layer or a solder bump.

In one embodiment, the transistor in the through-substrate via is a power gate that can be used to control a voltage reference network in an IC. By controlling the power gate, the IC can activate, deactivate, or adjust the voltage reference network. Moreover, an IC can include multiple transistors formed in multiple through-substrate vias. Forming the transistors vertically in the through-substrate via can reduce the amount of area needed for the transistor on the IC relative to using a planar transistor. As such, the size of the IC can be reduced or additional logic can be deposited in the IC.

Figure 1:
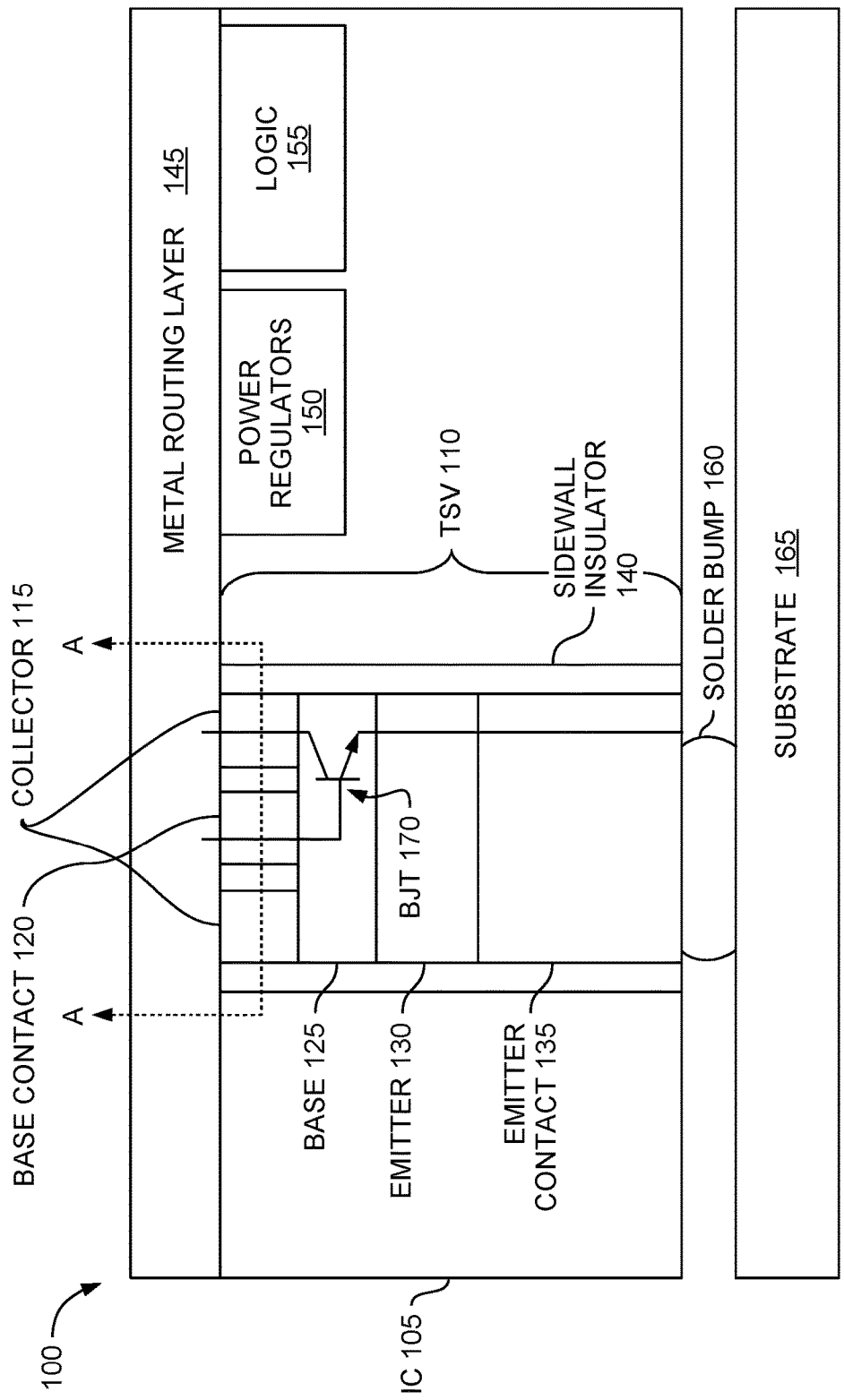
FIG. 1 illustrates a transistor formed in a through-substrate via in an IC, according to one embodiment described herein.

FIG. 1 illustrates a transistor formed in a through-substrate via 110 (TSV) in an IC 105 where the substrate can be a semiconductor material or other type of supportive material. When the IC 105 includes at least one layer of crystalline silicon, the through-substrate via 110 can be considered a through silicon via. It is assumed for the embodiments below that the acronym "TSV" refers to a through silicon via rather than a through substrate via unless otherwise stated; however, in other embodiments a transistor can be formed in a through via in other ICs that are formed from semiconductor material besides silicon.

In this embodiment, the TSV 110 includes a BJT 170 that is formed using a vertical stack of semiconductor layers in the TSV 110. In this example, the BJT 170 includes a collector 115, a base contact 120, a base 125, an emitter 130, and an emitter contact 135 which are disposed within a sidewall insulator 140. As shown in more detail below, the sidewall insulator 140 forms a cylindrical shape in which the layers and contacts of the BJT 170 are disposed. In one embodiment, the sidewall insulator 140 defines an outer boundary of the TSV 110 which electrically isolates the material and layers in the TSV 110 from the IC 105.

The base 125, the emitter 130, and the collector 115 are a doped semiconductor material—e.g., silicon. For example, the base 125 may be a layer of P-doped silicon while the collector 115 and the emitter 130 are layers of N-doped silicon to form an NPN BJT. However, a PNP BJT is formed when the base 125 is a layer of N-doped semiconductor material and the collector 115 and the emitter 130 are layers of P-doped semiconductor material. Thus, the collector 115, the base 125, and the emitter 130 form a vertical NPN or PNP junction in the TSV 110. Moreover, although the embodiments use the BJT 170 as an example of a transistor formed in the TSV 110, this disclosure is not limited to such and other types of transistors can be formed in the TSV 110.

The base contact 120 and the emitter contact 135 can be formed from any conductive material. For example, the contacts 120 and 135 may be metal—e.g., gold, aluminum, or tungsten. As shown, the base contact 120 directly contacts the base 125 while the emitter contact 135 directly contacts the emitter 130. The base contact 120, however, is electrically isolated from the collector 115. Further, the sidewall insulator 140 isolates the layers and structures in the TSV 110 from logic and structures that are disposed outside the TSV 110 within the IC 105.

The IC 105 includes a metal routing layer 145 for coupling the BJT 170 to circuitry or logic disposed outside the TSV 110. Although not shown in detail in FIG. 1, the metal routing layer can include of multiple metal routing layers separated by dielectric layers from routing signals between logic formed within an active area in the IC 105. In FIG. 1, the IC 105 includes power regulators 150 and logic 155 (e.g., CMOS logic) disposed in the active area which can be electrically coupled to the collector 115 or the base contact 120 via the metal routing layer 145. For example, the active area may include a crystalline semiconductor layer (e.g., crystalline silicon) that is disposed over an insulator layer (e.g., silicon dioxide) and a semiconductor substrate—e.g., a silicon-on-insulator (SOI) structure. However, in another embodiment, the IC may not include an insulation layer— e.g., is formed entirely from a semiconductor material. In either case, the TSV 110 extends through the IC 105 (assuming the metal routing layer 145 is not considered part of the IC 105). Thus, the TSV 110 can conduct current from a top surface of the IC 105 on which the metal routing layer 145 is disposed to a bottom surface of the IC 105.

Figure 2:
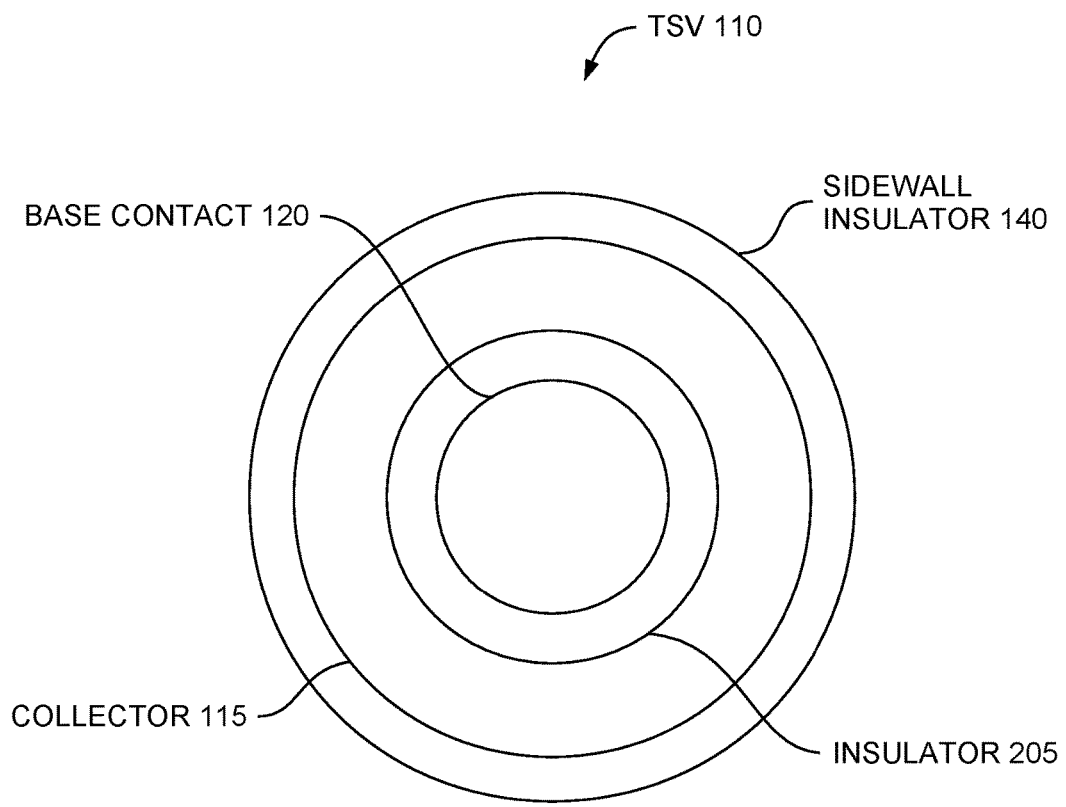
FIG. 2 illustrates a cross sectional view of the transistor formed in the through-substrate via in FIG. 1, according to one embodiment described herein.

The emitter contact 135 is coupled at the bottom surface of the IC 105 to a solder bump 160 which is in turn coupled to a substrate 165. In one embodiment, the substrate 165 is another IC or electrical component that, for example, receives power from the power regulators 150 via the BJT 170 in the TSV 110. For example, the substrate 165 may be a processor that includes cores that are powered by the power regulators 150. Controlling the BJT 170 (e.g., a power gate) determines whether not the substrate 165 receives power from the power regulators 150. Moreover, the BJT 170 can determine whether the substrate 165 receives full power or lesser power (e.g., a low power mode). Although using the BJT 170 as a power gate is specifically described herein, the embodiments are not limited to such. The BJT 170 can be used for any other type of switching or regulating FIG. 2 illustrates a cross sectional view of the transistor formed in the TSV 110 in FIG. 1, according to one embodiment described herein. Specifically, FIG. 2 illustrates a cross section of the TSV 110 in FIG. 1 along the dotted line labeled A-A. As shown, the base contact 120, an insulator 205, the collector 115, and the sidewall insulator 140 are concentric circles however other shapes are also possible— e.g., rectangular or elliptical. The insulator 205 can be formed from any insulative material which electrically isolates the base contact 120 from the collector 115. Moreover, the collector 115 forms an annular shape (e.g., a hollow cylinder in this embodiment) where the base contact 120 is disposed in the central opening of the annular shape. The insulator 205 can be the same material as the sidewall insulator 140 or a different material.

Figure 3A:
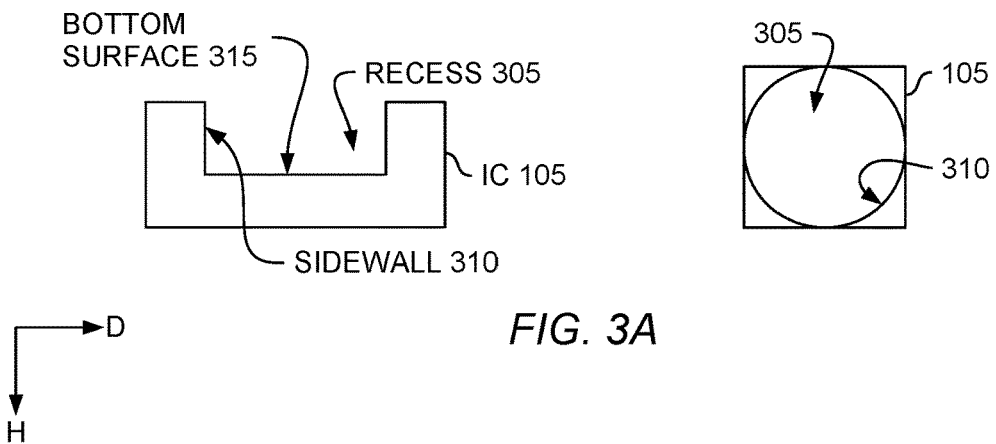
FIGS. 3A-3K illustrate forming a transistor in a through-substrate via, according to one embodiment described herein.

FIGS. 3A-3K illustrate forming a transistor in a TSV, according to one embodiment described herein. For clarity, FIGS. 3A-3K each illustrate a cross sectional side view of the IC 105 (through the center of the TSV) along with a corresponding top view of the IC 105. In FIG. 3A, the IC 105 is etched to form a recess 305 defined by a sidewall 310 and a bottom surface 315. In this embodiment, the IC 105 is not etched all the way through.

The dimensions of the recess 305 may be a diameter (D) that ranges from 1 to 100 microns and a height (H) that ranges from 100 microns to 1 millimeter. The recess 305 may be formed using a deep reactive-ion etching. In one embodiment, the IC 105 is a solid semiconductor substrate but in another embodiment the IC 105 may include a SOI structure at the bottom.

Figure 3B:
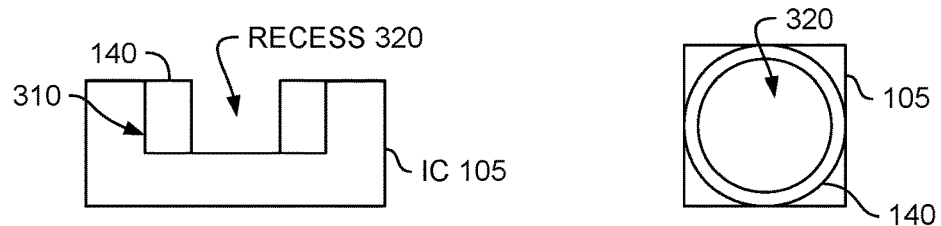

FIG. 3B illustrates forming the sidewall insulator 140 on the sidewall 310 of the recess 320. In one embodiment, the insulative material of the sidewall insulator 140 is deposited to fill the recess 305. Using a mask, the center portion of the insulative material is removed to form the recess 320. In another embodiment, the sidewall insulator 140 may be grown from the material of the IC 105 at the sidewalls 310. For example, if the IC 105 is crystalline silicon, silicon dioxide could be grown on the sidewall 310 to form the sidewall insulator 140. Separate masking and anisotropic etching steps can be used to remove growth of the insulator on the planar surfaces (e.g., the bottom surface 315) while leaving the insulator on the vertical surfaces.

Figure 3C:
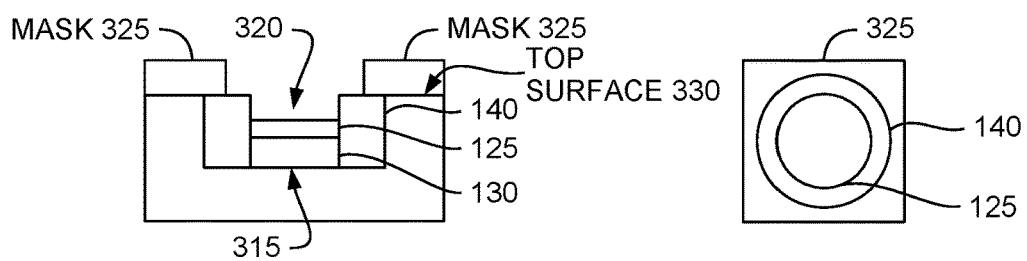

FIG. 3C illustrates depositing a mask 325 on a top surface of the IC 105 and forming the emitter 130 and the base 125 in the recess 320. In one embodiment, the mask 325 is silicon nitride but can be any suitable masking material.

In one embodiment, the semiconductor material at the bottom surface 315 functions as a seed layer for epitaxially growing the emitter 130 and the base 125 in the recess 320. For example, if the IC 105 is crystalline silicon, when silicon is deposited in the recess 320 in the presence of a vacuum, the bottom surface 315 acts like a seed layer to facilitate the growth of crystalline silicon for forming the emitter 130 and the base 125. Although crystalline silicon is described here, the emitter 130 and the base 125 can be other types of crystalline semiconductor.

As mentioned above, the emitter 130 and the base 125 are doped to form a PN junction. To form a NPN BJT, the emitter 130 is doped N-type while the base 125 is doped P-type. However, to form a PNP BJT, the reverse is true.

In one embodiment, the emitter 130 and the base 125 are doped while the crystalline semiconductor forming these layers is grown on the bottom surface 315. For example, the dopant may be deposited in parallel with depositing silicon onto the bottom surface 315. In another embodiment, the emitter 130 and the base 125 are doped after the crystalline material is formed. For example, ion implantation can be used to insert desired concentrations of the dopants into the emitter 130 and the base 125.

Figure 3D:
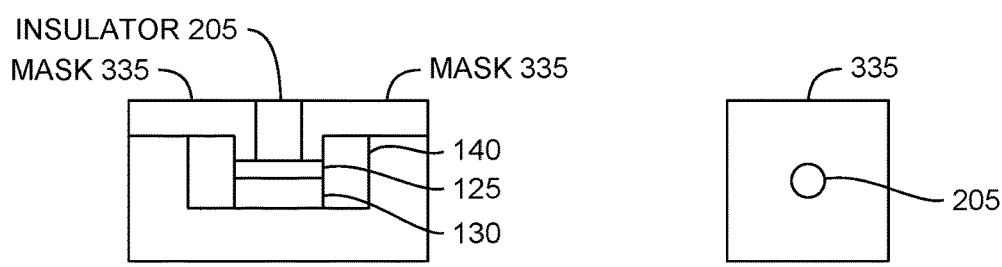

FIG. 3D illustrates forming a mask 335 on the top surface 330 which covers the sidewall insulator 140 and at least a portion of the base 125. Once the mask 335 is formed, the insulator 205 is deposited on the still exposed center portion of the base 125.

Figure 3E:
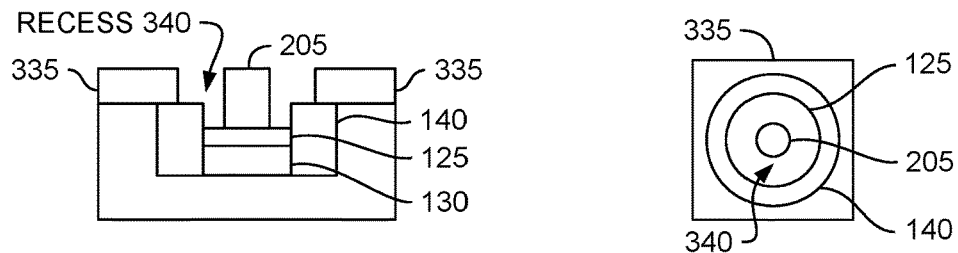

FIG. 3E illustrates removing a portion of the mask 335 contacting the insulator 205. As such, the insulator 205 forms a pillar arranged in the center of the base 125 which is separated from the mask 335 by a recess 340. In one embodiment, another mask (not shown) is deposited on the mask 335 in order to remove the portion of the mask 335 surrounding the insulator 205. For example, the recess 340 can be formed by using an etchant that selectively etches the material of the mask 335 but not the material of the insulator 205. For example, the insulator 205 may be silicon dioxide while the mask 335 is silicon nitride. Doing so exposes the portion of the base 125 which is not covered by the insulator 205.

Figure 3F:
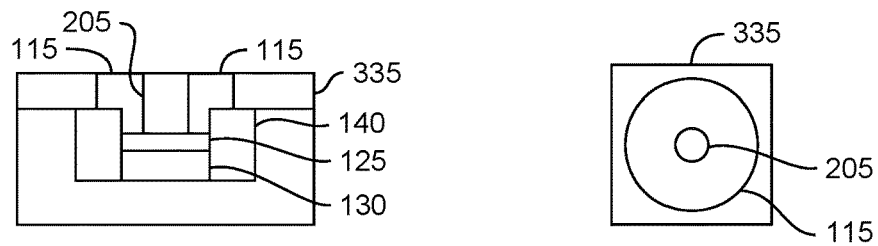

FIG. 3F illustrated forming the collector 115 on the base 125. In one embodiment, the collector 115 is crystalline semiconductor that is grown using the base 125 as a seed layer. For example, if the base 125 is crystalline silicon, depositing additional silicon on the base 125 forms a crystalline silicon structure for the collector 115. However, dopants are added either when forming the collector 115 or after the collector 115 is formed using ion implantation to dope the collector 115 differently from the base 125. In this manner, the collector 115, base 125, and the emitter 130 can form a PNP or NPN vertical structure in the through via.

Figure 3G:
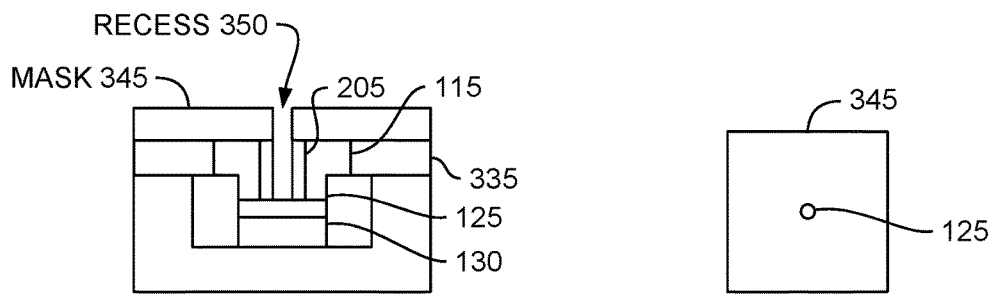

FIG. 3G illustrates depositing a mask 345 that covers the mask 335 and all but a center portion of the insulator 205. The mask 345 provides an opening for etching the insulator 205 in order to form a recess 350 that extends from the mask 345 to the base 125. However, when forming the recess 350, at least some of the insulator 205 remains such that the insulator 205 separates the recess 350 from the collector 115. Put differently, the insulator 205 forms a cylindrical annular structure.

Figure 3H:
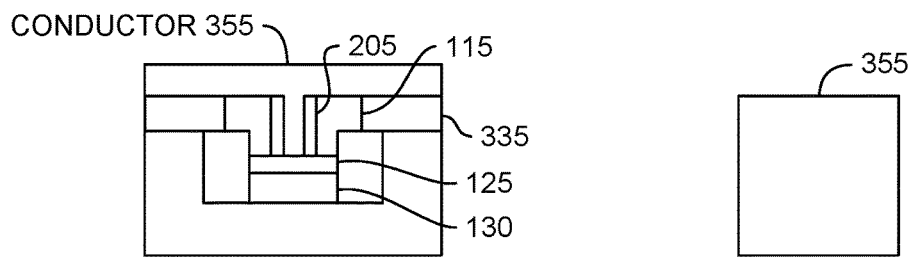

FIG. 3H illustrates removing the mask 345 and then depositing a conductor 355 onto the top surface which fills the recess 350. As such, the conductor 355 forms an electrical contact with the base 125. The conductor 355 can be any conductive material such as a conductive metal, e.g., tungsten, aluminum, gold, and the like. In this example, the insulator 205 provides a barrier which electrically insulates the conductor 355 from the surrounding collector 115.

Figure 3I:
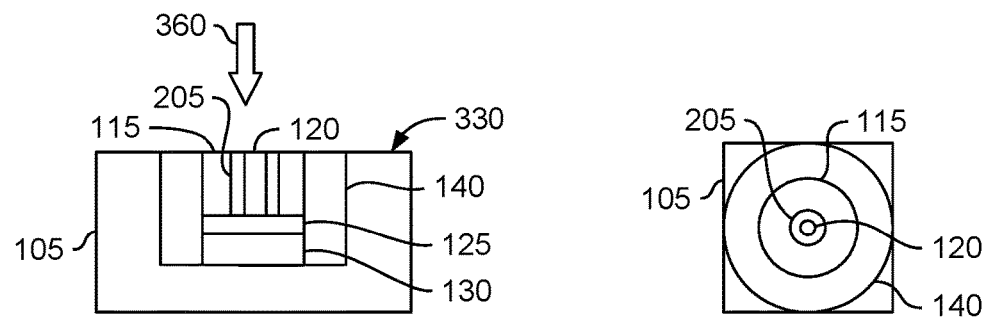

FIG. 3I illustrates planarizing the IC 105 to remove a portion of the conductor 355 and the mask 335. For example, a chemical mechanical polish (CMP) process may be used in the direction of the arrow 360 in order to remove a portion of the conductor 355 and the mask 335 shown in FIG. 3H. Further, the CMP process removes a portion of the collector 115. In one embodiment, the CMP process removes any material that was above the top surface 330 of the IC 105. In one embodiment, planarizing the IC 105 to the top surface 330 removes any stray growth on the insulator 205.

The remaining portion of the conductor 355 forms the base contact 120 which provides a conductive path so that metal layers disposed on the top surface 330 can be electrically coupled to the base 125 which is disposed between the collector 115 and the emitter 130 in the vertical stack.

Figure 3J:
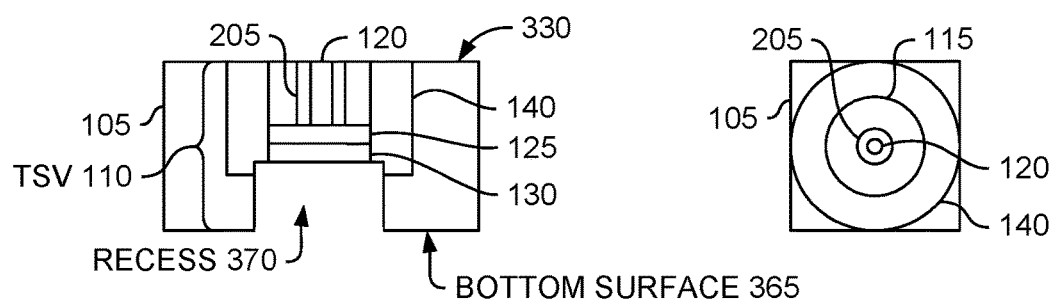

FIG. 3J illustrates etching the IC 105 from a bottom surface 365 opposite the top surface 330. In one embodiment, the etch can performed using a deep reactive-ion etch or using laser ablation. In one embodiment, the etch is controlled such that a portion of the material forming the emitter 130 is removed. Although this is not necessary, over-etching the emitter 130 as shown in FIG. 3J ensures that a recess 370 formed during the etching process extends from the bottom surface 365 to the material of the emitter 130. That is, over-etching the emitter 130 ensures that there is not a thin layer of the material of the IC 105 that is still covering the emitter 130 after the etching process is complete. However, in another embodiment, the recess 370 may be formed without over-etching the emitter 130.

Once the recess 370 is formed, the IC 105 now has a through-substrate via (e.g., a through silicon via 110) that extends from the top surface 330 of the IC 105 to the bottom surface 365 of the IC 105. However, the embodiments herein are not limited to silicon but can be used to form transistors in any through-substrate vias regardless of the semiconductor IC.

Figure 3K:
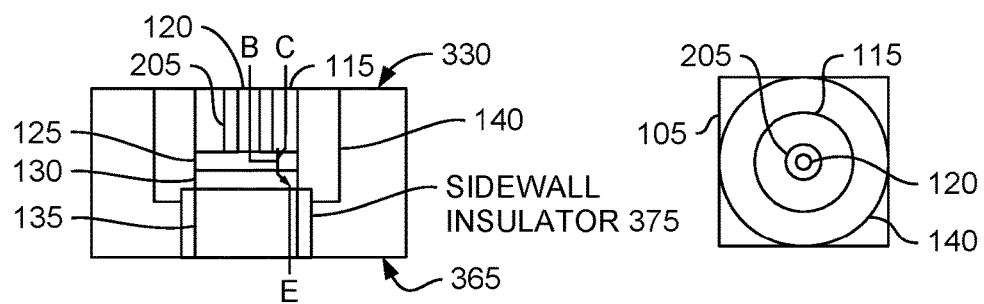

FIG. 3K illustrates completing the TSV 110 with the emitter contact 135 which electrically couples the bottom surface 365 to the emitter 130. Before forming the emitter contact 135, a sidewall insulator 375 is formed at the sides of the recess 370. In one embodiment, the insulative material of the sidewall insulator 375 is deposited to fill the recess 370. Using a mask, the center portion of the insulative material is removed to form a volume for the emitter contact 135. In another embodiment, the sidewall insulator 375 may be grown from the material of the IC 105 at the sidewall of the recess 370. For example, if the IC 105 is crystalline silicon, silicon dioxide could be grown on the sidewall of the recess 370 to form the sidewall insulator 375. The emitter 130 (which forms the bottom of the recess 370) can be masked to prevent the growth of the insulative material on that surface. Moreover, the sidewall insulator 375 contacts the sidewall insulator 140 to form a continuous insulative sidewall barrier from the top surface 330 of the IC 105 to the bottom surface 365 which electrically insulates the transistor in the TSV 110 from other components in the IC 105.

Once the sidewall insulator 375 is formed, the conductive material of the emitter contact 135 (e.g., tungsten, aluminum, gold, etc.) can be deposited directly onto the emitter 130 and fills the recess 370. The emitter contact 135 may provide a bond pad for applying a solder ball for connecting the TSV 110 to an external substrate. In another example, another layer of conductive material may be deposited and patterned to form a solder pad on the bottom surface 365 which is electrically connected to the emitter contact 135. In another embodiment, a metal routing layer (e.g., a redistribution layer) can be formed on the bottom surface 365 which can electrically connect the emitter contact 135 to other contact pads or logic in the IC 105 rather than connecting the emitter contact 135 to an external substrate.

In one embodiment, a metal routing layer (e.g., a redistribution layer) is formed on the top surface 330. The metal routing layer can include contacts for connecting the base contact 120 and the emitter 130 to different contact pads or logic in the IC 105. In one embodiment, the metal routing layer can connect the base contact 120 and the emitter 130 to solder pads which can then couple to an external substrate.

Figure 4:
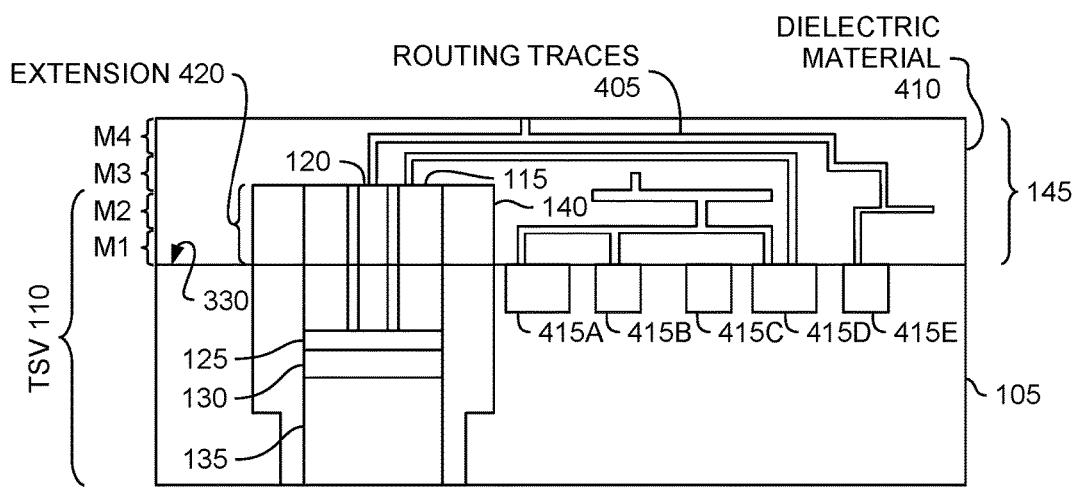
FIG. 4 illustrates coupling a transistor in a through-substrate via to a metal routing layer, according to one embodiment described herein.

FIG. 4 illustrates coupling a transistor in the TSV 110 to a metal routing layer 145, according to one embodiment described herein. In this embodiment, the TSV 110 is coupled to routing traces 405 in the metal routing layer 145. As shown, the metal routing layer 145 includes multiple individual metal layers (shown as M1, M2, M3, and M4). In one embodiment, the metal layers closer to the top surface 330 may be reserved for transmitting data signals—e.g., high speed, low power signals. The routing traces 405 in these layers may have smaller widths than the routing traces 405 in the layers further from the top surface 330. The smaller widths may mean the routing traces 405 carry less current. Further, the density of the routing traces 405 in the metal layers closer to the top surface 330 (e.g., layers M1 and M2) may be greater than the density of the routing traces 405 in the layers further away (e.g., layers M3 and M4).

In FIG. 4, the transistor in the TSV 110 (e.g., the BJT) may be a power gate and is used to provide power to a processing core or a voltage network. As such, the TSV 110 may need to couple to routing traces 405 that can handle greater amounts of current or withstand higher voltages. Because the routing traces 405 in layers M1 and M2 may be too small, in FIG. 4, the TSV 110 includes an extension 420 which enables the TSV 110 to extend into the upper metal layers—e.g., M3. The routing traces 405 in the upper metal layers may be wider and/or thicker in order to handle greater currents and voltages.

In order to connect the TSV 110 to the upper layer in the metal routing layer 145, each time a fabrication process is used to form the lower layers in the metal routing layer 145, the sidewall insulator 140, collector 115, the insulator 205 and the base contact 120 can be extended. That is, in parallel with forming the routing traces 405 and dielectric in the lower portion of the metal routing layer, the extension 420 is formed to build up the TSV 110 above the top surface 330. Thus, as the thickness of the metal routing layer 145 increases, so does the height of the extension 420. Eventually, the TSV 110 extends into the upper portion of the metal routing layer 145 which includes routing traces 405 designed to handle the larger voltages or currents used by a power network. As shown in FIG. 4, the base contact 120 and the collector 115 are coupled to routing traces 405 in the layers M3 and M4. However, the TSV 110 may extend to any metal layer which can depend on the specific design of the IC 105.

Using the metal routing layer 145, the electrical connections to the TSV 110 can be routed to different components in the IC 105. For example, the IC 105 includes different logical and power components 415. In this example, the base contact 120 and the collector 115 are coupled to the components 415E and 415D, respectively. In one embodiment, these components may be power regulators or other power components used to activate and deactivate the BJT formed within the TSV 110.

Figure 5:
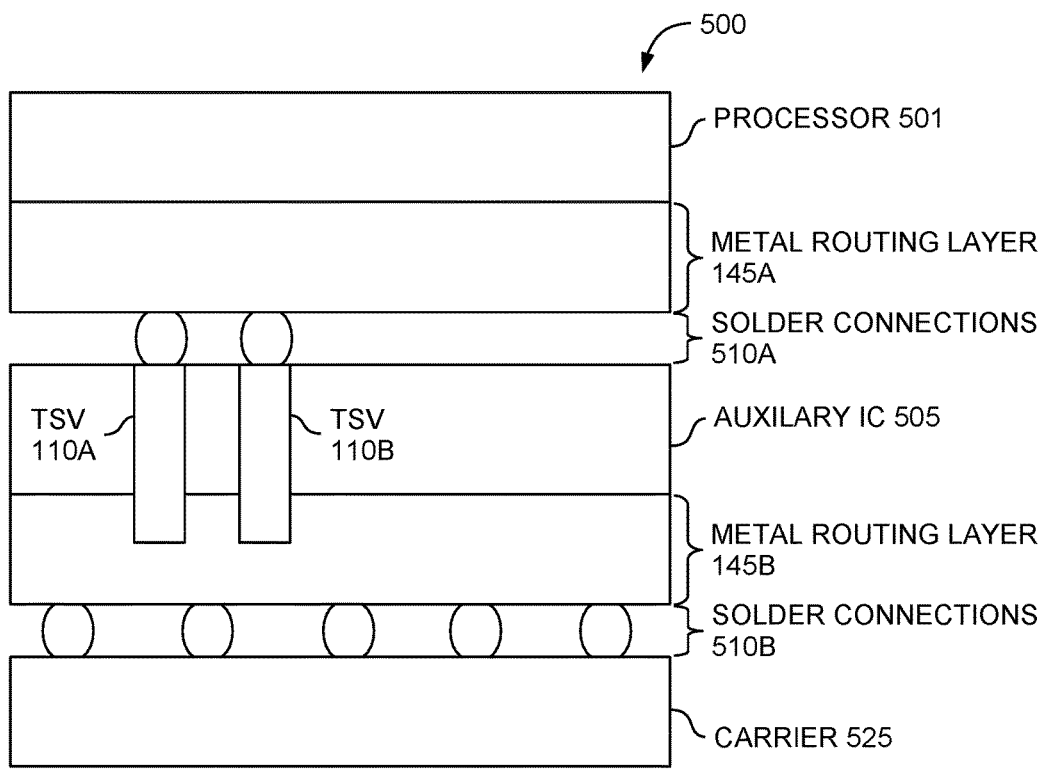
FIG. 5 illustrates a package that includes an IC with multiple transistors in through-substrate vias, according to one embodiment described herein.

FIG. 5 illustrates a package 500 that includes an auxiliary IC 505 with multiple transistors in TSVs 110, according to one embodiment described herein. As shown, the TSVs 110 in the auxiliary IC 505 are coupled at a first end (the bottom end in FIG. 5) to a metal routing layer 145B. Like in FIG. 4, the first end of the TSVs 110 protrude into the metal routing layer 145B in order to connect routing traces in metal layers that are further from the auxiliary IC 505. The metal routing layer 145B can electrical connect the first end of the TSVs to either logic in the auxiliary IC 505 or to a carrier 525 using solder connections 510B. For example, power regulators or voltage supplies disposed in either the auxiliary IC 505 or the carrier 525 can be coupled to the TSVs 110 using the metal routing layer 145B.

Second ends of the TSVs 110 are exposed on a top surface of the auxiliary IC 505. Using solder connections 510A, the second ends of the TSVs 110 are connected to a metal routing layer 145A disposed on a processor 501. In one embodiment, the transistors in the TSVs 110 are used to regulate the power supplied to the processor 501 from either the auxiliary IC 505 or the carrier 525. For example, the TSV 110A may provide power to a first processing core in the processor 501 while the TSV 110B provides power to a second processing core in the processor 501. In one embodiment, the package 500 may be disposed in a data center supporting a cloud environment where a customer can purchase the use of the processing cores in the processor 501. If the customer pays for both the first and second cores, logic in the auxiliary IC 505 or the carrier 525 can activate the transistors in the TSVs 110A and 110B such that both the first and second cores in the processor 501 are powered. However, if the customer only pays for the use of one of the cores, one of the TSVs 110 can be deactivated such that only one of the cores in the processor 501 is available to process the data for the client.

Further, the transistors in the TSVs 110 can dictate how much power the cores in the processor 501 receive. For example, if switched to a power-saving mode, the transistors in the TSVs 110 can be controlled to reduce the amount power provided to the core which can result in power savings.

Figure 6:
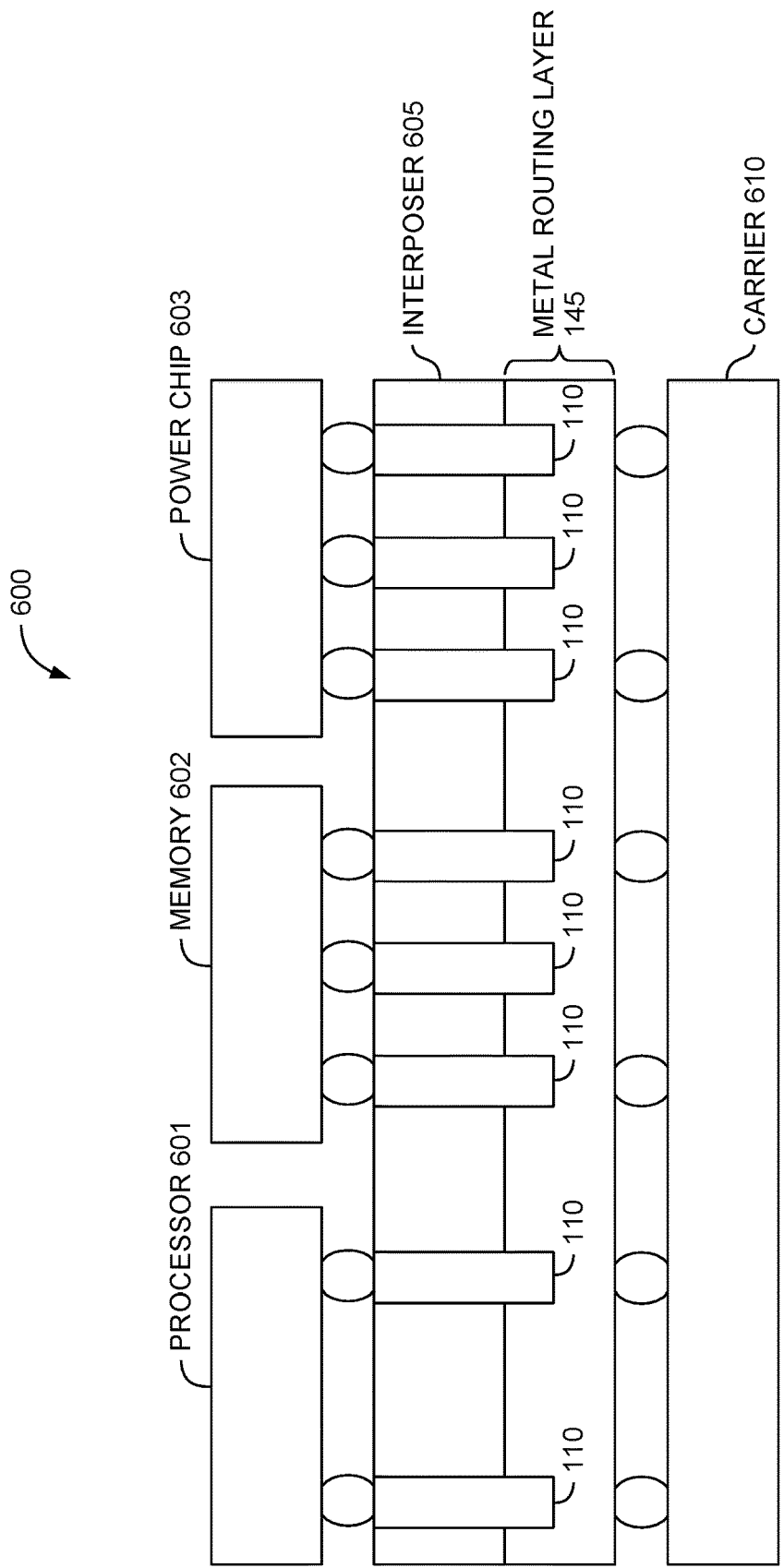
FIG. 6 illustrates a package that includes an interposer with multiple transistors in through-substrate vias, according to one embodiment described herein.

FIG. 6 illustrates a package 600 that includes an interposer 605 with multiple transistors in TSVs 110, according to one embodiment described herein. The package 600 includes a processor 601, a memory 602, and a power chip 603, which are connected to first ends of the TSVs 110 disposed in the interposer 605. The interposer 605 includes a metal routing layer 145 which is coupled to second ends of the TSVs 110. In one embodiment, the TSV 110 route electrical power provided by the power regulators and power sources in the power chip 603 to the memory 602 and the processor 601. In this manner, the interposer 605 can be used to arrange the processor 601, the memory 602, and the power chips 603 in a side-by-side fashion. Although not shown, the interposer 605 may include other through substrate vias which do not include transistors for routing data signals between the chips. For example, the interposer 605 may include through substrate vias (which do not include transistors) that route commands and data between the processor 601 and the memory 602 so that the processor 601 can read data from, and write data to, the memory 602.

The metal routing layer 145 is also coupled to a carrier 610 which can couple the package 600 to a PCB or other signal carrying medium. As described above, the transistors in the TSVs 110 can be controlled to regulate how much power is drawn from, or delivered to, the processor 601, memory 602, and power chip 603. Although the processor 601, memory 602, and power chip 603 are shown as single chips (or layers), in other embodiments, these components may include multiple chips or layers that are interconnected using solder bumps or thermal compression connections. For example, the memory 602 may include a stack of layers of memory chips that are interconnected using thermal compression connections.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference was made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described above are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A semiconductor substrate, comprising:
a through-substrate via (TSV) comprising:
   a sidewall insulator defining an outer boundary of the TSV, and
   a bipolar junction transistor disposed within the sidewall insulator, the bipolar junction transistor comprising:
      a first semiconductor layer doped with a first-type of dopant, wherein the first semiconductor layer comprises a collector,
      a second semiconductor layer doped with a second-type of dopant, wherein the second semiconductor layer comprises a base, and
      a third semiconductor layer doped with the first-type of dopant, wherein the third semiconductor layer comprises an emitter, and wherein the first, second, and third semiconductor layers are arranged in the TSV to form one of: a PNP junction and an NPN junction, wherein the base is disposed between the collector and the emitter in the TSV, wherein a material of the collector forms an annular shape, wherein a base contact is disposed in a central opening of the annular shape, wherein the base contact comprises a conductive material that directly contacts the base in the second semiconductor layer.

2. The semiconductor substrate of claim 1, wherein the TSV extends from a top surface of the semiconductor substrate to a bottom surface of the semiconductor substrate opposite the top surface, wherein the base contact and the collector are closer to the top surface than the emitter and wherein the emitter is closer to the bottom surface than the base contact and the collector.

3. The semiconductor substrate of claim 1, further comprising:
a metal routing layer comprising routing traces electrically coupling the bipolar junction transistor to electrical components disposed in the semiconductor substrate that are outside of the sidewall insulator.

4. An assembly, comprising:
a through-substrate via (TSV) extending through a semiconductor substrate, the TSV comprising:
   a sidewall insulator, and
   a bipolar transistor disposed within the sidewall insulator, the bipolar transistor comprising:
      a first semiconductor layer doped with a first-type of dopant,
      wherein the first semiconductor layer comprises a collector,
      a second semiconductor layer doped with a second-type of dopant, wherein the second semiconductor layer comprises a base, and
      a third semiconductor layer doped with the first-type of dopant, wherein the third semiconductor layer comprises an emitter;
   a first substrate; and
   a solder connection coupling a first end of the TSV to the first substrate, wherein the base is disposed between the collector and the emitter in the TSV, wherein a material of the collector forms an annular shape, wherein a base contact is disposed in a central opening of the annular shape, and wherein the base contact comprises a conductive material that directly contacts the base in the second semiconductor layer.

5. The assembly of claim 4, a metal routing layer disposed on the semiconductor substrate, wherein a second end of the TSV opposite the first end is electrically coupled to at least one routing trace in the metal routing layer.

* * * * *